United States Patent
Tseng et al.

(10) Patent No.: US 7,241,693 B2
(45) Date of Patent: Jul. 10, 2007

(54) PROCESSING METHOD FOR PROTECTION OF BACKSIDE OF A WAFER

(75) Inventors: Kuo-Pang Tseng, Hsin-Chu (TW); Lung-An Lee, Hsin-Chu (TW); Yin-Fu Huang, Hsin-Chu (TW); Chih-Chia Hsu, Hsin-Chu (TW); Cheng-Hsiung Lee, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 74 days.

(21) Appl. No.: 11/107,885

(22) Filed: Apr. 18, 2005

(65) Prior Publication Data

US 2006/0234506 A1    Oct. 19, 2006

(51) Int. Cl.
*H01L 21/302*   (2006.01)
*H01L 21/311*   (2006.01)

(52) U.S. Cl. ............... 438/689; 438/720; 438/745
(58) Field of Classification Search ........ 438/689, 438/702, 703
See application file for complete search history.

(56) References Cited

U.S. PATENT DOCUMENTS

| | | | | |
|---|---|---|---|---|
| 3,986,912 A | * | 10/1976 | Alcorn et al. | 438/713 |
| 5,328,722 A | * | 7/1994 | Ghanayem et al. | 427/250 |
| 5,633,209 A | * | 5/1997 | Leedy | 216/2 |
| 5,716,873 A | * | 2/1998 | Prall et al. | 438/669 |
| 5,914,278 A | * | 6/1999 | Boitnott et al. | 438/724 |
| 5,958,796 A | * | 9/1999 | Prall et al. | 438/694 |
| 6,043,152 A | * | 3/2000 | Chang et al. | 438/680 |
| 6,060,400 A | * | 5/2000 | Oehrlein et al. | 438/706 |
| 6,475,399 B2 | * | 11/2002 | Choi | 216/12 |
| 6,670,283 B2 | * | 12/2003 | Baker et al. | 438/758 |
| 6,777,334 B2 | * | 8/2004 | Shiu et al. | 438/689 |
| 6,787,397 B2 | * | 9/2004 | Swanson et al. | 438/118 |
| 6,803,570 B1 | * | 10/2004 | Bryson et al. | 250/305 |
| 7,037,851 B2 | * | 5/2006 | Gueneau de Mussy et al. | 438/739 |
| 2002/0001964 A1 | * | 1/2002 | Choi | 438/719 |
| 2003/0096507 A1 | * | 5/2003 | Baker et al. | 438/778 |
| 2005/0023656 A1 | * | 2/2005 | Leedy | 257/678 |
| 2005/0026429 A1 | * | 2/2005 | Liaw | 438/689 |
| 2005/0074960 A1 | * | 4/2005 | Gueneau de Mussy et al. | 438/619 |
| 2006/0160353 A1 | * | 7/2006 | Gueneau de Mussy et al. | 438/624 |

* cited by examiner

*Primary Examiner*—Nikita Wells
*Assistant Examiner*—Bernard Souw
(74) *Attorney, Agent, or Firm*—Birch, Stewart, Kolasch & Birch, LLP

(57) ABSTRACT

A temporal protection layer is employed to a wafer backside for use of micro-electro-mechanical systems (MEMS). The formation of the temporal protection layer prevents the wafer backside from scratch in process of transferring system for IC manufacturers. With regard to low cost and easy forming and removing, an oxide layer is used as the temporal protection layer. The throughput and yield rate of the wafer production are improved by the use of the temporal protection layer.

9 Claims, 1 Drawing Sheet

US 7,241,693 B2

PROCESSING METHOD FOR PROTECTION OF BACKSIDE OF A WAFER

BACKGROUND OF THE INVENTION

1. Field of the Invention

The present invention generally relates to a method for protecting the backside of a wafer in process of transferring for IC manufacturers. In particular, the present invention relates to a method for protecting the backside of a wafer with micro-electro-mechanical systems (MEMS) thereon.

2. Description of the Prior Art

In common IC fabrications (fabs), the front-side or topside of a wafer is mainly concerned due to all IC devices and elements constructed on the topside of the wafer. Thereof the wafer uses to be delivered with touching of backside of wafer transfer systems, for example, robot, picker and etc. In another word, the process of fabricating IC will be continued even if the backside of the wafer is scratched slightly by an operator and wafer transfer systems. But it is necessary that there is no breakdown of the wafer due to scratches even though after high temperature process, and damage the IC devices on and within the wafer.

Oppositely, both topside and backside of a MEMS (micro-electro-mechanical systems) wafer are concerned on application. There may be IC devices, micro-electro elements or micro-mechanical elements on the both sides on a MEMS wafer. On other applications, there may be other devices assembled with the backside of the MEMS wafer, such as ink jet print-head chips of the MEMS wafer. Accordingly, the backside of the MEMS wafer should be regarded as important as the topside of the MEMS wafer. Unfortunately, the most of transfer wafer systems in IC fabs are in touch with the backside of MEMS wafers when delivering MEMS wafers as well as those general wafers, so as to result in the damage or scratch on the backside of MEMS wafer. The damaged and scratched MEMS wafers make process of fabricating MEMS fail then the wafers must to be scraped. There is much lost of throughput and yield rate of MEMS products due to these issues.

SUMMARY OF THE INVENTION

In view of the forgoing, one embodiment of the present invention is to provide a processing method for the protection of the backside of a MEMS wafer in process of IC manufacturers to solve the above-mentioned problems. A protective layer is provided to cover the backside of the MEMS wafer to prevent the backside from directly touching in wafer transfer systems.

Another one embodiment of the present invention is to provide a temporal protection structure on the backside of the MEMS wafer to reduce the scratch of the MEMS wafer in process of IC manufacturers and the cost of modification on hardware system for IC manufacturers. An oxide layer is formed on the backside of the MEMS wafer is capable to protect a low-stress nitride layer on the backside of the MEMS wafer.

Accordingly, one embodiment of the present invention provides a processing method for protection of a backside of a wafer in process of a transferring system. A wafer has a topside and the backside opposite thereto and includes a semiconductor device region near the topside. A barrier layer is formed on the backside and then a protective layer is formed on and adjacent to the barrier layer of the backside.

These and other aspects of the invention are not intended to define the scope of the invention for which purpose claims are provided. In the following description, reference is made to the accompanying drawings, which form a part hereof, and in which there is shown by way of illustration, preferred embodiments of the invention. Such embodiments do not define the scope of the invention and reference must be made therefore to the claims for this purpose.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 1A:
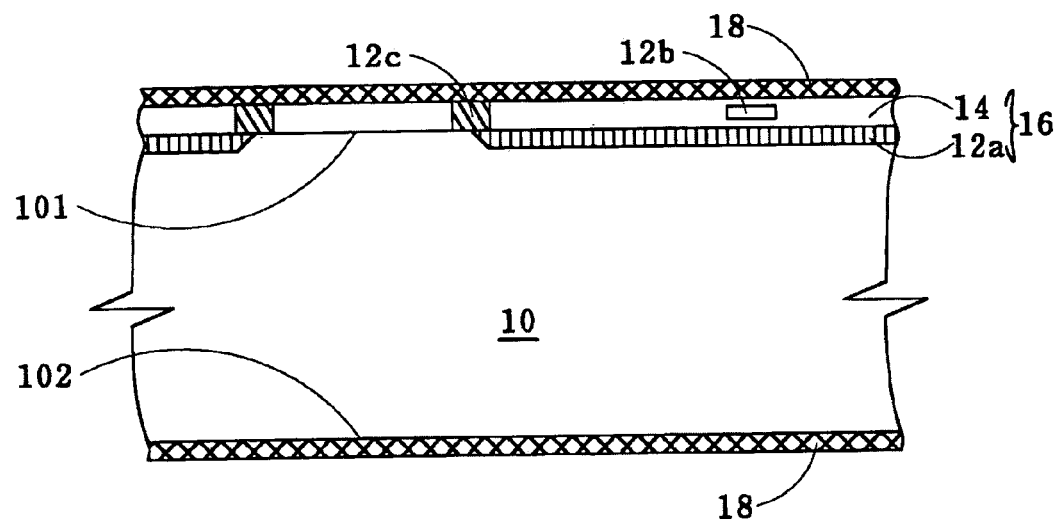
FIG. 1A is a cross-sectional diagram illustrating a wafer in accordance with one embodiment of the present invention.

Referring to FIG. 1A is a cross-sectional diagram illustrating a wafer in accordance with one embodiment of the present invention. In process of semiconductor manufacturing, a semiconductor wafer 10 is employed to form a semiconductor device region 16 on the topside 101. A backside 102 of the semiconductor wafer 10 is opposite to the topside 101. In one embodiment, the semiconductor wafer 10 is a silicon wafer for general applications, but not limited to. In a preferred embodiment, the semiconductor wafer 10 would be further implemented with a MEMS process for a MEMS product. The so-called MEMS process is to fabricating MEMS components by forming, patterning one or more various layers on the topside 101 or/and backside 102 of the semiconductor wafer 10, but not limited to. Alternatively, micro-electro elements or/and micro-mechanical elements would be added on the topside 101 or/and backside 102 of the semiconductor wafer 10.

The semiconductor device region 16 would include IC device regions 12a under the topside 101, a dielectric layer 14 on the topside 101 and some conductive structures 12b and 12c in or through the dielectric layer 14. In the embodiment, the dielectric layer 14 is a silicon dioxide formed by any suitable conventional method, such as deposition, but not limited to. The conductive structures 12b and 12c would be metal contacts, but not limited to. Next, another dielectric layers 18 are formed on the semiconductor device region 16 and the backside 102, respectively. In one embodiment, the dielectric layers 18, such as silicon nitride layers, act as barrier layers to prevent an exterior substance, such as fluid, through the dielectric layer 14 or/and the backside 102. Alternatively, the dielectric layers 18 may be a mask layer for further process, such as MEMS process. In preferred embodiment, each dielectric layer 18 is a low-stress silicon nitride layer with the thickness about from 5000 to 15000

Angstroms by a low-pressure chemical vapor deposition (LPCVD), but not limited to. It is noted that the formation of the low-stress silicon nitride layer is susceptible to its internal properties, such as low stress and uniformity. Thus, the thickness of the low-stress silicon nitride layer is restricted.

Figure 1B:
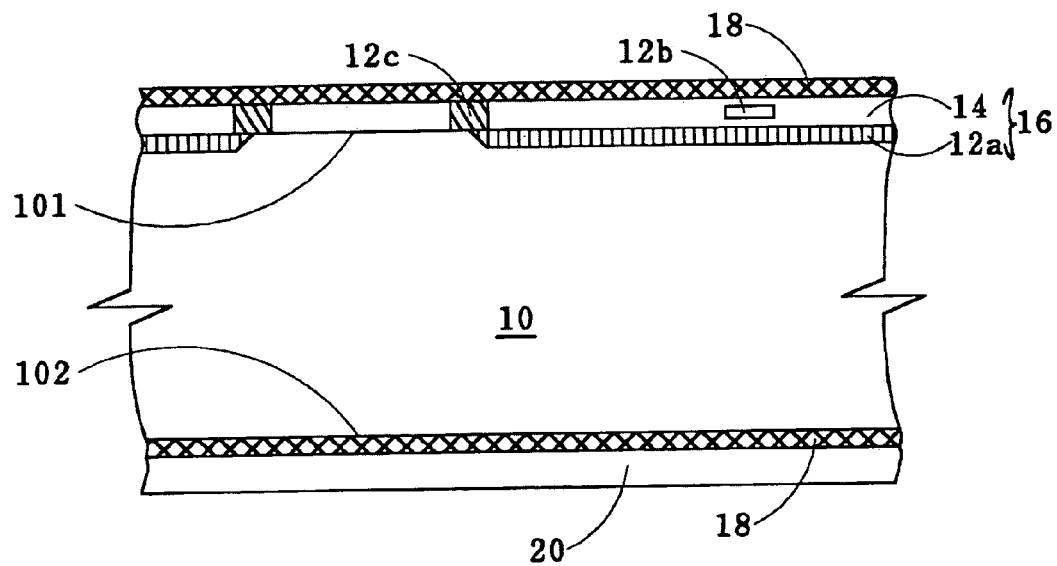
FIG. 1B is a cross-sectional diagram illustrating a protective layer on the backside of the wafer in accordance with one embodiment of the present invention.

In concerning the importance of the dielectric layers 18, especially the one on the backside 102 which is susceptible to scratch or damage in process of conventional transferring system for the IC manufacturers, a protective layer 20 would be formed on and adjacent to the dielectric layer 18 of the backside 102, shown in FIG. 1B. In the embodiment, the protective layer 20 is an oxide layer. In the preferred embodiment, the protective layer 20 is a silicon dioxide layer formed by a plasma enhanced chemical vapor deposition (PECVD) with the thickness about 5000 to 10000 Angstrom, but not limited to. Alternatively, the protective layer 20 may be formed on the dielectric layer 18 of the topside 101. According to one aspect of the present invention, the protective layer 20 is temporally existed on the backside 102 (or also on the topside 101) for the sake of the protection of the backside 102 in the process of the transferring systems for the IC manufacturers. Once the semiconductor wafer 10 is done through the IC manufacturers and then transferred to the MEMS process, the protective layer 20 would be easily removed by any conventional method, such as wet or dry etching process. The features of low-cost oxide layer also reduce the cost of the modification on the hardware transferring system for the IC manufacturers.

Accordingly, one embodiment of the present invention a processing method for a backside of a silicon wafer for use of micro-electro-mechanical systems (MEMS). The silicon wafer has a topside and the backside opposite thereto and includes a semiconductor device region near the topside. Two silicon nitride layers are deposited on the backside and the topside, respectively. Two oxide layers are then deposited on and adjacent to the two silicon nitride layers, respectively whereby protecting the two silicon nitride layers from scratch in process of a transferring system.

Accordingly, variations of the embodiments described herein will become apparent to those having ordinary skill in the art, and such variations are within the scope of the present invention, as defined by the following claims.

What is claimed is:

1. A processing method for protection of a backside of a wafer in process of a transferring system; comprising:
   providing said wafer having a topside and said backside opposite thereto, wherein said wafer comprises a semiconductor device region near said topside and said semiconductor device region comprises a IC device region, a dielectric layer and a plurality of conductive structures;
   forming a first barrier layer on said backside, wherein said first barrier layer be used as a mask for following process; and
   forming a first protective layer on and adjacent to said barrier layer of said backside.

2. The processing method according to claim 1, wherein said step of forming said first barrier layer comprises depositing a low-stress nitride layer.

3. The processing method according to claim 1, wherein said step of forming said first protective layer comprises depositing an oxide layer.

4. The processing method according to claim 1, wherein said step of forming said barrier layer farther deposits a second barrier layer over said semiconductor device region and said topside.

5. The processing method according to claim 4, wherein said step of forming said first protective layer further deposits a second protective layer over said second barrier layer.

6. A processing method for a backside of a silicon wafer for use of micro-electro-mechanical systems (MEMS), comprising:
   providing said silicon wafer having a topside and said backside opposite thereto, wherein said silicon wafer comprises a semiconductor device region near said topside and said semiconductor device region comprises a IC device region, a dielectric layer and a plurality of conductive structures;
   depositing two silicon nitride layers on said backside and said topside, respectively, wherein said silicon nitride layers be used as a mask for following process; and
   depositing an oxide layer on and adjacent to said silicon nitride layer of said backside, whereby protecting said silicon nitride layer of said backside from scratch in process of a transferring system.

7. The processing method according to claim 6, wherein a thickness of said oxide layer on said backside is in the range of 5000 to 10000 Angstroms.

8. The processing method according to claim 6, wherein said step of depositing on said backside is a low-stress silicon nitride layer.

9. The processing method according to claim 6, wherein said oxide layer is formed by a plasma enhanced chemical vapor deposition (PECVD) process.

* * * * *